(12) United States Patent  
Mikado et al.

(10) Patent No.: US 9,320,148 B2  
(45) Date of Patent: Apr. 19, 2016

(54) PRINTED WIRING BOARD

(75) Inventors: Yukinobu Mikado, Ogaki (JP); Shunsuke Sakai, Ogaki (JP); Hirofumi Futamura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 1000 days.

(21) Appl. No.: 13/431,091

(22) Filed: Mar. 27, 2012

(65) Prior Publication Data

US 2012/0250277 A1  Oct. 4, 2012

Related U.S. Application Data

(60) Provisional application No. 61/468,907, filed on Mar. 29, 2011.

(51) Int. Cl.
*H05K 1/02* (2006.01)
*H05K 1/16* (2006.01)
*H05K 1/18* (2006.01)
(Continued)

(52) U.S. Cl.
CPC .......... *H05K 1/185* (2013.01); *H01L 23/49894* (2013.01); *H01L 23/5389* (2013.01); *H01L 24/24* (2013.01); *H05K 1/0271* (2013.01); *H01L 2224/12105* (2013.01); *H01L 2224/32225* (2013.01); *H01L 2224/73267* (2013.01); *H01L 2224/92244* (2013.01); *H01L 2924/01029* (2013.01); *H01L 2924/12042* (2013.01); *H05K 3/4602* (2013.01); *H05K 2201/068* (2013.01); (Continued)

(58) Field of Classification Search
CPC ..................... H01L 23/5389; H01L 23/49894; H01L 24/24; H01L 2224/92244; H01L 2924/01029; H01L 2224/73267; H01L 2224/12105; H01L 2224/32225; H05K 1/185; H05K 3/4602; H05K 2201/10674; H05K 2203/0191; H05K 2203/1469; H05K 2201/068; H05K 1/0271
USPC .................. 174/250–268; 361/760, 792–795
See application file for complete search history.

(56) References Cited

U.S. PATENT DOCUMENTS

| 2006/0175083 A1* | 8/2006 | Muramatsu et al. ......... 174/260 |
| 2007/0064375 A1* | 3/2007 | Urashima et al. ............ 361/311 |
| 2010/0163290 A1* | 7/2010 | Nagata ......................... 174/260 |

FOREIGN PATENT DOCUMENTS

JP  2002-246722  8/2002

OTHER PUBLICATIONS

U.S. Appl. No. 13/307,480, filed Nov. 30, 2011, Mikado, et al.  
(Continued)

*Primary Examiner* — Ishwarbhai B Patel  
(74) *Attorney, Agent, or Firm* — Oblon, McClelland, Maier & Neustadt, L.L.P.

(57) ABSTRACT

A printed wiring board includes a core substrate having a penetrating hole extending through the core substrate, an electronic component accommodated in the penetrating hole of the core substrate, a filler resin filling clearance between the component and the core substrate, a first resin insulation layer formed on the component and a first surface of the core substrate, and a second resin insulation layer formed on the component and a second surface of the core substrate on the opposite side of the first surface of the core substrate. The filler resin has elastic modulus which is set to be lower than 0.2 Gpa and thermal expansion coefficient which is set to be higher than 100 ppm and lower than 200 ppm, and the core substrate has elastic modulus which is set to be higher than 30 Gpa, and thermal expansion coefficient which is set to be lower than 10 ppm.

11 Claims, 9 Drawing Sheets

(51) Int. Cl.
  *H05K 3/46* (2006.01)
  *H01L 23/538* (2006.01)
  *H01L 23/00* (2006.01)
  *H01L 23/498* (2006.01)
(52) U.S. Cl.
  CPC ............... *H05K 2201/10674* (2013.01); *H05K 2203/0191* (2013.01); *H05K 2203/1469* (2013.01)

(56) References Cited

OTHER PUBLICATIONS

U.S. Appl. No. 13/273,532, filed Oct. 14, 2011, Shimizu, et al.
U.S. Appl. No. 13/455,295, filed Apr. 25, 2012, Mikado, et al.
U.S. Appl. No. 13/332,463, filed Dec. 21, 2011, Mikado, et al.

* cited by examiner

FIG. 7

| Example | X1 × Y1 (mm) | X2 × Y2 (mm) | W × L (mm) | X3 × Y3 (mm) | Core Substrate CTE (ppm) | Core Substrate Elastic Modulus (Gpa) | Filler Resin CTE (ppm) | Filler Resin Elastic Modulus (Gpa) | Warping Amount or Undulation Amount (mm) |
|---|---|---|---|---|---|---|---|---|---|
| 1 | 8.3 × 8.3 | 11 × 11 | 91 × 91 | 7.5 × 7.5 | 14 | 28 | 46 | 4 | 1.69 |
| 2 | 8.1 × 8.1 | 11 × 11 | 91 × 91 | 7.5 × 7.5 | 14 | 28 | 46 | 4 | 1.55 |
| 3 | 8.1 × 8.1 | 11 × 11 | 91 × 91 | 7.5 × 7.5 | 14 | 28 | 150 | 0.1 | 0.5 |
| 4 | 8.1 × 8.1 | 11 × 11 | 91 × 91 | 7.5 × 7.5 | 14 | 28 | 167 | 0.07 | 1.11 |
| 5 | 8.1 × 8.1 | 11 × 11 | 91 × 91 | 7.5 × 7.5 | 14 | 28 | 21 | 7.9 | 1.64 |
| 6 | 8.1 × 8.1 | 11 × 11 | 91 × 91 | 7.5 × 7.5 | 5-6 | 32 | 46 | 4 | 0.84 |
| 7 | 8.3 × 8.3 | 11 × 11 | 91 × 91 | 7.5 × 7.5 | 5-6 | 32 | 46 | 4 | 1.11 |
| 8 | 8.3 × 8.3 | 11 × 11 | 91 × 91 | 7.5 × 7.5 | 5-6 | 32 | 150 | 0.1 | 0.21 |
| 9 | 8.3 × 8.3 | 11 × 11 | 91 × 91 | 7.5 × 7.5 | 5-6 | 32 | 167 | 0.07 | 0.57 |
| 10 | 8.3 × 8.3 | 11 × 11 | 91 × 91 | 7.5 × 7.5 | 1.2 | 4 | 46 | 4 | 1.71 |
| 11 | 8.1 × 8.1 | 11 × 11 | 91 × 91 | 7.5 × 7.5 | 1.2 | 4 | 46 | 4 | 1.59 |

FIG. 8
(A)
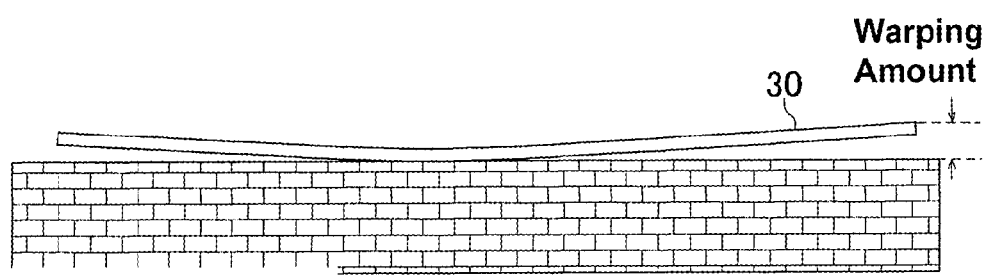
(B)
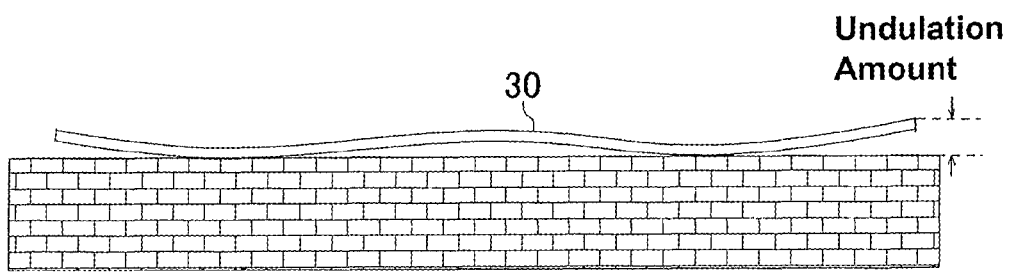

PRINTED WIRING BOARD

CROSS-REFERENCE TO RELATED APPLICATIONS

The present application is based on and claims the benefit of priority to U.S. Application No. 61/468,907, filed Mar. 29, 2011, the entire contents of which are incorporated herein by reference.

BACKGROUND OF THE INVENTION

1. Field of the Invention

The present invention relates to a printed wiring board with a built-in electronic component such as an IC chip.

2. Discussion of the Background

Accommodating an IC chip in an accommodation section of a core substrate via filler resin is described in Japanese Laid-Open Patent Publication 2002-246722. The elastic modulus of the filler resin is 250 Kgf/mm$^2$ or lower. The accommodation section to accommodate an electronic component is a recessed portion in Japanese Laid-Open Patent Publication 2002-246722. The entire contents of this publication are incorporated herein by reference.

SUMMARY OF THE INVENTION

According to one aspect of the present invention, a printed wiring board includes a core substrate having a penetrating hole extending through the core substrate, an electronic component accommodated in the penetrating hole of the core substrate, a filler resin filling a clearance between the electronic component and the core substrate, a first resin insulation layer formed on the electronic component and a first surface of the core substrate, and a second resin insulation layer formed on the electronic component and a second surface of the core substrate on the opposite side of the first surface of the core substrate. The filler resin has an elastic modulus which is set to be lower than 0.2 Gpa and a thermal expansion coefficient which is set to be higher than 100 ppm and lower than 200 ppm, and the core substrate has an elastic modulus which is set to be higher than 30 Gpa, and a thermal expansion coefficient which is set to be lower than 10 ppm.

According to another aspect of the present invention, a sheet-type printed wiring board includes printed wiring boards, and connectors joining the printed wiring boards. Each of the printed wiring boards has a core substrate having a penetrating hole extending through the core substrate, the core substrate has an elastic modulus which is set to be higher than 30 Gpa, and a thermal expansion coefficient which is set to be lower than 10 ppm, and the penetrating hole is formed to accommodate an electronic component and is formed such that the total area of penetrating holes on the first surfaces of core substrates is in the range of from 30% to 70% of the area of the surface of the sheet-type printed wiring board.

According to yet another aspect of the present invention, a sheet-type printed wiring board includes printed wiring boards, and a frame surrounding the printed wiring boards. Each of the printed wiring boards has a core substrate having a penetrating hole extending through the core substrate, the core substrate has an elastic modulus which is set to be higher than 30 Gpa, and a thermal expansion coefficient which is set to be lower than 10 ppm, the penetrating hole is formed to accommodate an electronic component and is formed such that the total area of penetrating holes on the first surfaces of core substrates is in the range of from 30% to 70% of the area of the surface of the sheet-type printed wiring board, and the sheet-type printed wiring board has the area of the surface which includes the area of the frame.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 shows results of example 1 through example 12;

FIGS. 8(A)-8(B) are views to illustrate the amount of warping and the amount of undulation.

DETAILED DESCRIPTION OF THE EMBODIMENTS

Figure 1:
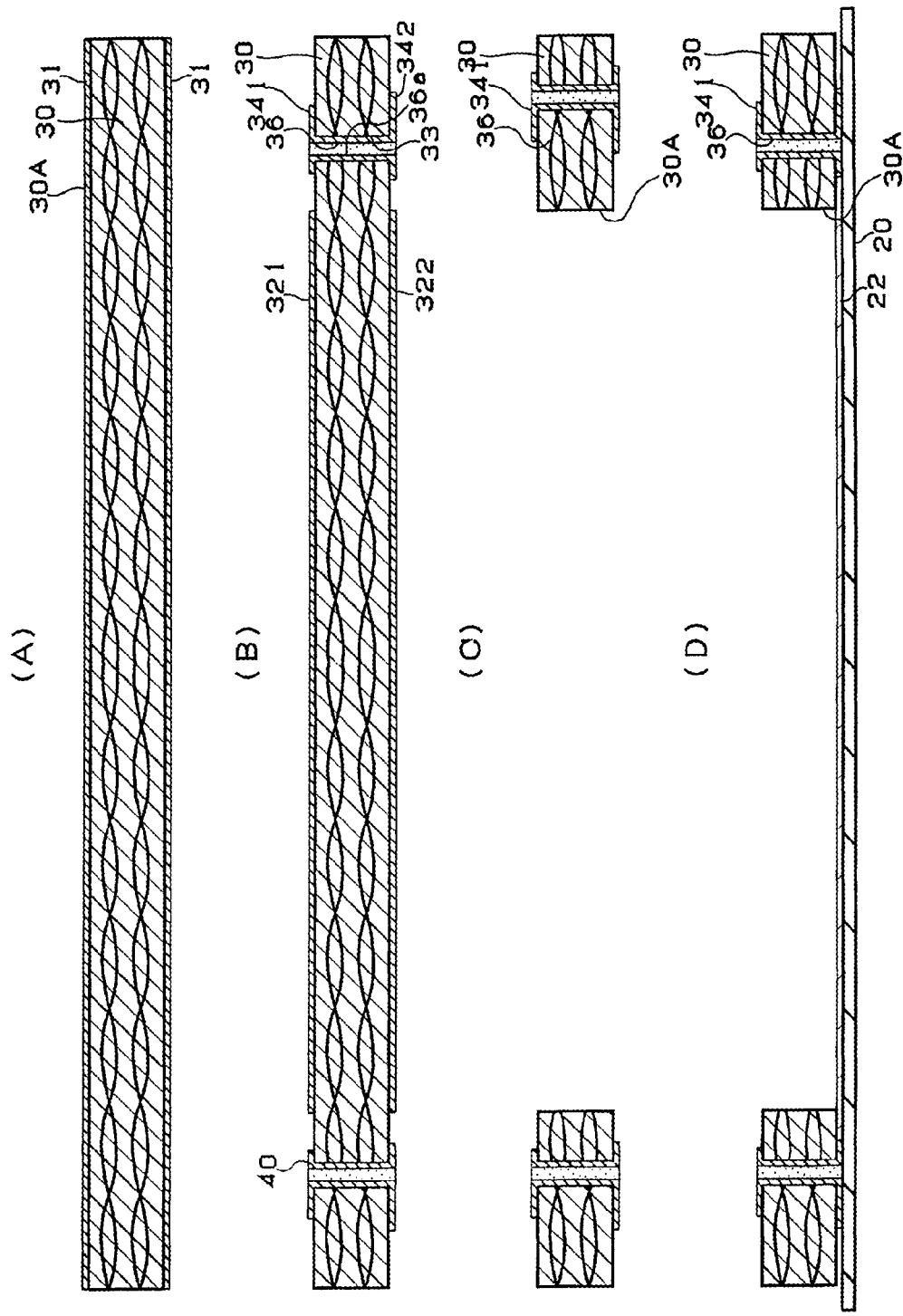
FIGS. 1(A)-1(D) are views showing steps of manufacturing a printed wiring board according to a first embodiment of the present invention.
Figure 2:
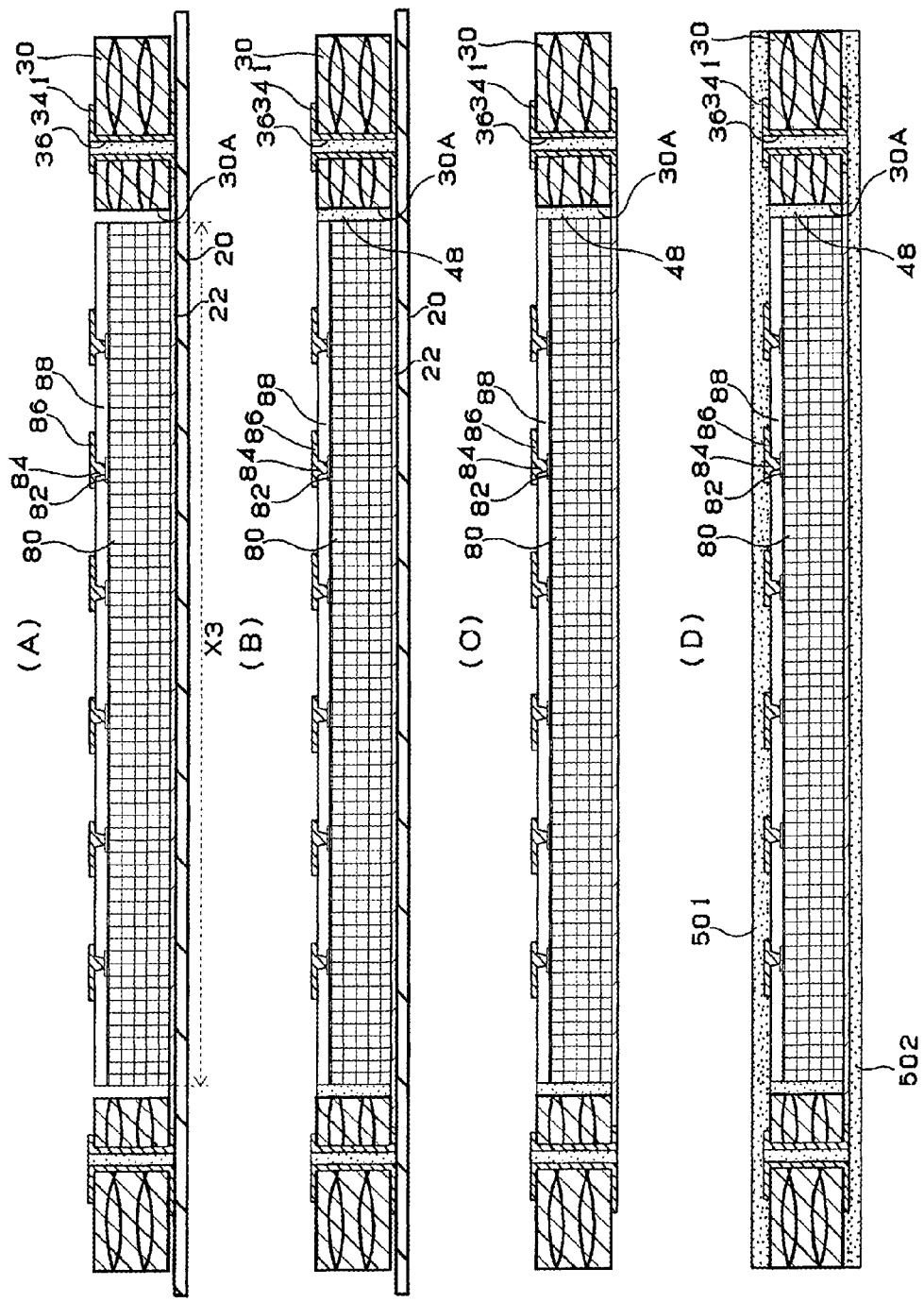
FIGS. 2(A)-2(D) are views showing steps of manufacturing a printed wiring board according to the first embodiment.
Figure 3:
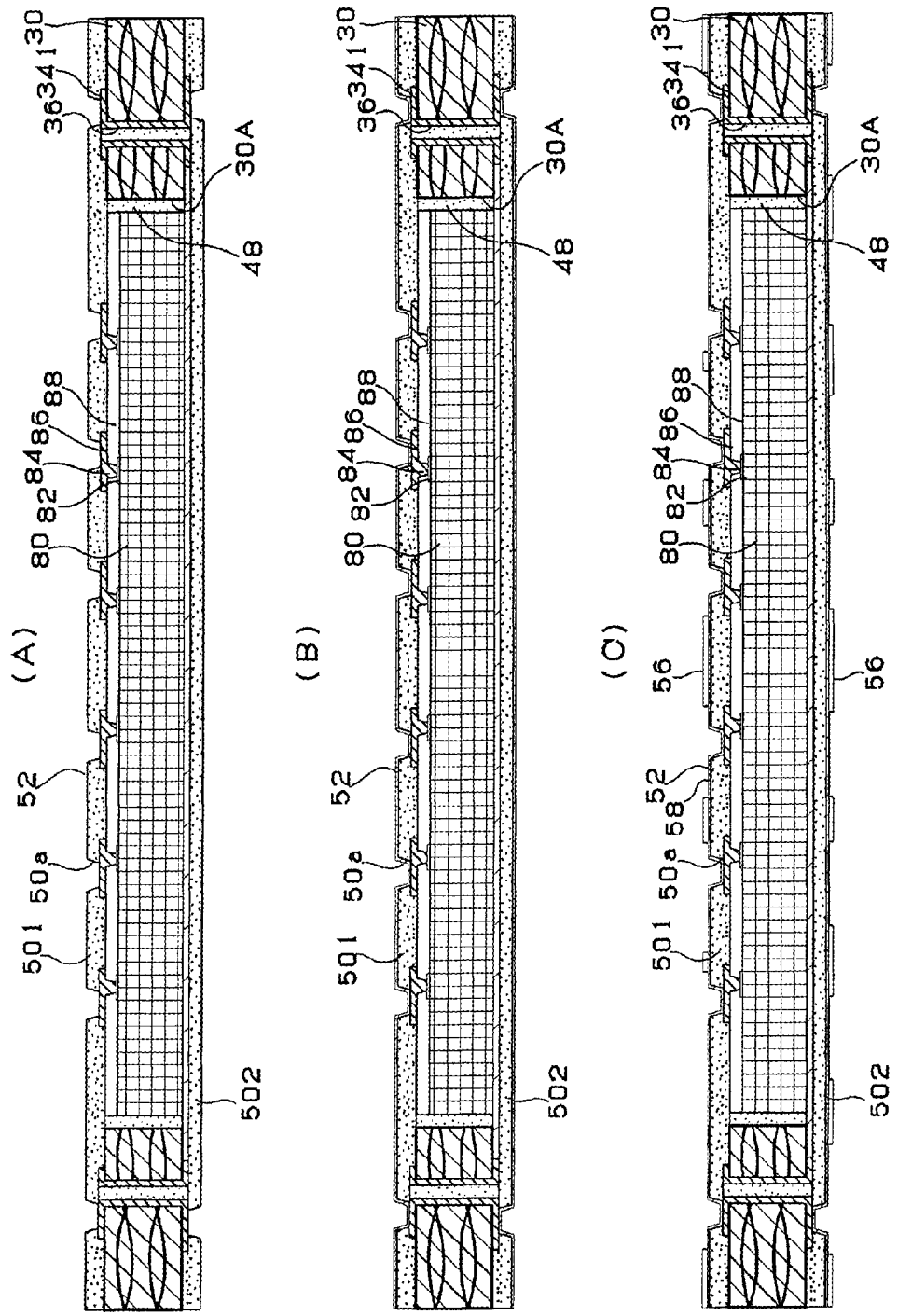
FIGS. 3(A)-3(C) are views showing steps of manufacturing a printed wiring board according to the first embodiment.
Figure 4:
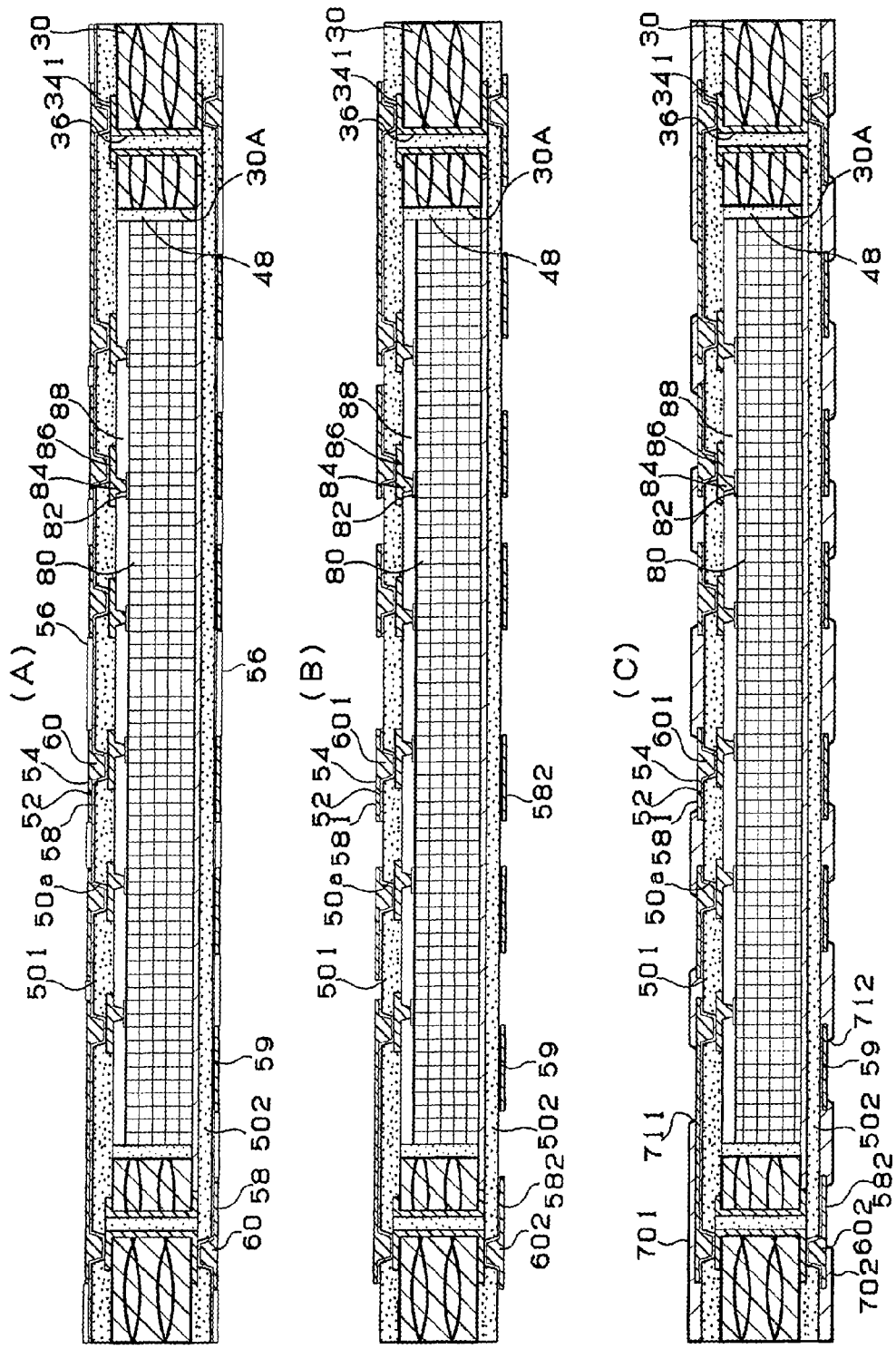
FIGS. 4(A)-4(C) are views showing steps of manufacturing a printed wiring board according to the first embodiment.

The embodiments will now be described with reference to the accompanying drawings, wherein like reference numerals designate corresponding or identical elements throughout the various drawings.

First Embodiment

Figure 5:
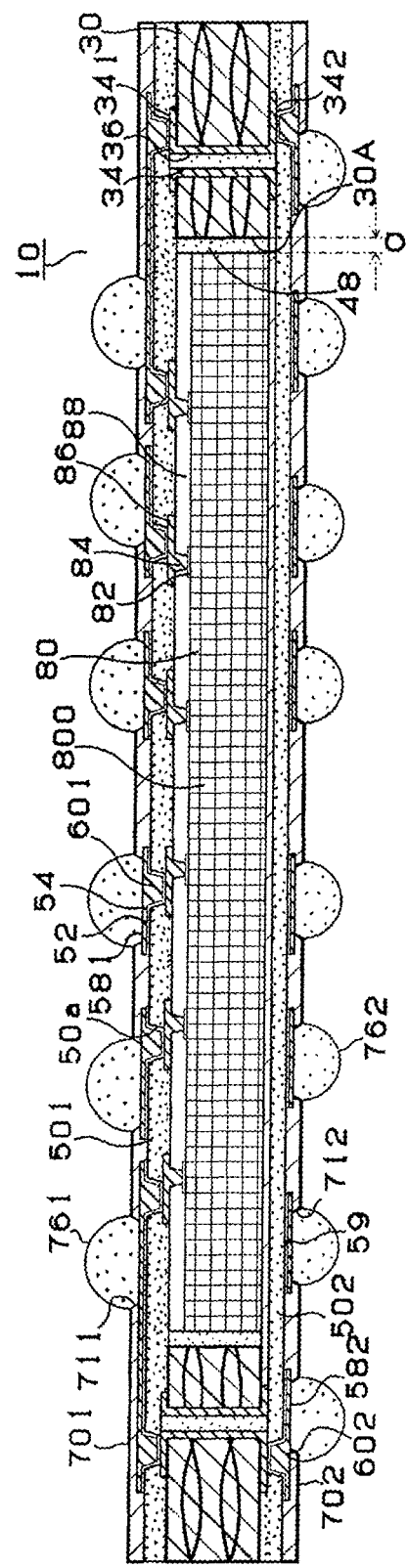
FIG. 5 is a cross-sectional view of a printed wiring board according to the first embodiment.

In the following, a first embodiment of the present invention is described by referring to the drawings. FIG. 5 shows a cross-sectional view of printed wiring board 10 according to the first embodiment of the present invention.

Printed wiring board 10 has core substrate 30 which has penetrating hole (30A) to accommodate electronic component 80 such as an IC chip, electronic component 80, filler resin 48, and first and second resin insulation layers (501, 502). The core substrate has a first surface and a second surface opposite the first surface. Conductive circuits (341, 342) are formed on the first surface and the second surface of the core substrate. The core substrate includes reinforcing material such as glass cloth. In core substrate 30, through-hole conductor 36 is formed, connecting conductive circuits (341, 342). Through-hole land 34 is formed around the through-hole conductor. First resin insulation layer 501 is formed on the first surface of the core substrate and has via conductor 601. Also, conductive circuit 581 is formed on first resin insulation layer 501. Second resin insulation layer 502 is formed on the second surface of the core substrate and has via conductor 602. Also, conductive circuit 582 is formed on second resin insulation layer 502.

Solder-resist layers (701, 702) are formed on resin insulation layers (501, 502). Solder bump 761 is formed in opening portion 711 in upper-surface side solder-resist layer 701, and solder bump 762 is formed in opening 712 in lower-layer side solder-resist layer 702.

Built-in IC chip 80 has die pad 82 and a rewiring layer which is formed on substrate 800 with resin layer 88 and conductive layer 86. The die pad and the conductive layer are connected by via hole 84.

IC chip 80 is accommodated in penetrating hole (30A) formed in core substrate 30 via filler resin 48. From a viewpoint of fixing the electronic component to the inner walls of the penetrating hole, clearance is preferred to be 50 μm to 500 μm. The thermal expansion coefficient of IC chip 80 is 3~5 ppm and is different from the thermal expansion coefficient of materials usually used for a printed wiring board. Accordingly, when an electronic component such as an IC chip is built into a penetrating hole in the core substrate, warping or undulation tends to occur in the printed wiring board. That is because the strength of a core substrate is reduced if the core substrate has a penetrating hole. Especially, when the size of a built-in electronic component increases, the penetrating hole is enlarged, and thus warping of the printed wiring board becomes greater. To solve problems (such as warping, undulation, connection reliability and mounting productivity) of a printed wiring board having an electronic component in a penetrating hole, the elastic modulus of filler resin 48 is set lower than 0.2 Gpa in the first embodiment. The elastic modulus of the filler resin is preferred to be 0.1 MPa or higher. The amount that the filler resin presses against the resin insulation layer on the filler resin is reduced. The thermal expansion coefficient of filler resin 48 is higher than 100 ppm but lower than 200 ppm. The elastic modulus of core substrate 30 is higher than 30 Gpa. The thermal expansion coefficient of the core substrate is lower than 10 ppm. The elastic modulus of the core substrate is preferred to be 300 GPa or lower. Cracking seldom occurs in the core substrate. The thermal expansion coefficient of the core substrate is preferred to be 1 ppm or higher. Its difference from the thermal expansion coefficient of the electronic component decreases.

In the first embodiment, the elastic moduli and thermal expansion coefficients of filler resin 48 and core substrate 30 are adjusted at predetermined values, thus reducing stress caused by a difference in the thermal expansion coefficients of the core substrate and the IC chip. Then, such stress is absorbed by the filler resin. According to the printed wiring board of the first embodiment, stress is reduced to such a level as to be absorbed by the filler resin. As a result, undulation or warping caused by a built-in electronic component in the penetrating hole is reduced, or undulation or warping does not occur.

Since the core substrate is flat, surfaces of resin insulation layers on the core substrate are also made flat. Thus, connection reliability is enhanced between the electronic component and conductive circuits on resin insulation layers. Also, fine conductive circuits (581, 582) are formed on resin insulation layers. Surfaces of the printed wiring board are made flat. Therefore, when an electronic component is mounted on a surface of the printed wiring board, productivity improves. Connection reliability is enhanced between the electronic component mounted on a surface of the printed wiring board and conductive circuits of the printed wiring board.

In a printed wiring board of the first embodiment, since the thermal expansion coefficients are different in IC chip 80 and the core substrate, when the temperature of the printed wiring board changes, the distance (clearance) is changed between the IC chip and an inner wall of the penetrating hole. Accordingly, stress is exerted on the filler resin. In the first embodiment, since the difference in thermal expansion coefficients is small between the core substrate and the electronic component, such stress is weak. Also, since the elastic modulus of the filler resin is lower than 0.2 Gpa in the first embodiment, the filler resin absorbs such stress. When bumps are formed and an electronic component is mounted on a printed wiring board of the first embodiment, the printed wiring board of the first embodiment is exposed to high heat in a reflow oven. Since the filler resin is softened, adhesiveness of the filler resin is reduced. If the adhesiveness is reduced, peeling tends to occur between the filler resin and the electronic component or between the filler resin and the core substrate. Since the thermal expansion coefficient of the filler resin exceeds 100 ppm in the first embodiment, the filler resin presses against the IC chip and the core substrate. Accordingly, in the printed wiring board of the first embodiment, peeling seldom occurs between the filler resin and the electronic component or between the filler resin and the core substrate. In addition, since the thermal expansion coefficient of the filler resin does not exceed 200 ppm, the resin insulation layer is not peeled from the core substrate or the filler resin. When the filler resin presses against the IC chip and the core substrate, it also presses against the resin insulation layer on the filler resin. In the first embodiment, since the thermal expansion coefficient of the filler resin does not exceed 200 ppm, the amount that the filler resin presses against the resin insulation layer is small. Thus, the resin insulation layer is not peeled from the core substrate or the filler resin. Cracking is prevented in the resin insulation layer. Since the resin insulation layer and the filler resin are both formed with resin, peeling seldom occurs between them.

The thermal expansion coefficient of filler resin is approximately ten times that of a core substrate. Therefore, since the filler resin presses against the core substrate during a reflow process, warping or undulation tends to occur in the core substrate. If warping or undulation occurs in the core substrate, the printed wiring board warps or undulates, making it hard to mount an electronic component on a surface of the printed wiring board. However, since the elastic modulus of the core substrate in the first embodiment is higher than 30 Gpa, rigidity of the core substrate is high. Accordingly, in the first embodiment, even if the filler resin presses against the core substrate, warping or undulation of the core substrate is slight. As a result, according to the printed wiring board of the first embodiment, an electronic component is securely mounted on a surface of the printed wiring board.

In the following, a method for manufacturing printed wiring board 10 is described with reference to FIGS. 1~6.

(1) Double-sided copper-clad laminate (30A), made of core substrate 30 and copper foils 31, is prepared (FIG. 1(A)). The thermal expansion coefficient of the core substrate is 1 ppm or higher but lower than 10 ppm. The thermal expansion coefficient of the electronic component is close to that of the core substrate. Thus, warping or undulation is slight in the printed wiring board. The core substrate includes resin such as epoxy, reinforcing material made of S-glass or the like, and inorganic particles of silica or the like. The thermal expansion coefficient is modified by adjusting the amount of inorganic particles or the volume of reinforcing material contained in the core substrate. The thickness of the core substrate is between 40 μm and 400 μm. The length and width (size) of the core substrate are between 50 mm and 640 mm. As for the specific material, LαXY4785TH-B made by Sumitomo Bakelite Co., Ltd. is listed. The thermal expansion coefficient of the material is 5-6 ppm, and its elastic modulus is 32 GPa. First, penetrating hole 33 for through-hole conductor is formed in the copper-clad laminate using a drill. Electroless plated film and electrolytic plated film are formed on the inner walls of penetrating hole 33 and surfaces of double-sided copper-clad laminate (30A). Then, using a subtractive method, conductive circuits (341, 342), through-hole conductor 36, through-hole land 34 and conformal films (321, 322) are formed (FIG. 1(B)). Conformal films (321, 322) are metal film to form a penetrating hole for a built-in electronic component. In FIG. 1(B), conformal masks 32 are formed on the first surface and the second surface of the core substrate. Conformal films (321, 322) may be formed on either surface of the core substrate. In the first embodiment, since conformal films (321, 322) are formed on both surfaces of the core substrate, warping is reduced in an unfinished substrate shown in FIG. 1(B). When forming a penetrating hole for a built-in electronic component, a laser is irradiated from the first-surface side of the core substrate. In such a case, conformal film 321 formed on the first surface of the core substrate is formed directly above conformal film 322 with the core substrate positioned in-between, and the periphery of conformal film 321 is positioned outside the periphery of conformal film 322.

When a penetrating hole for a built-in electronic component is formed, a laser may be irradiated from the second-surface side of the core substrate. In such a case, conformal film 322 formed on the second surface of the core substrate is formed directly above conformal film 321 with the core substrate positioned in-between, and the outline of conformal film 322 is positioned outside the outline of conformal film 321. The penetrating hole for a built-in electronic component is easily formed.

(2) Next, a laser is irradiated along the outline of conformal film 32. Penetrating hole (30A) for a built-in electronic component is formed (FIG. 1(C)). Penetrating hole (30A) may also be formed mechanically.

Figure 6:
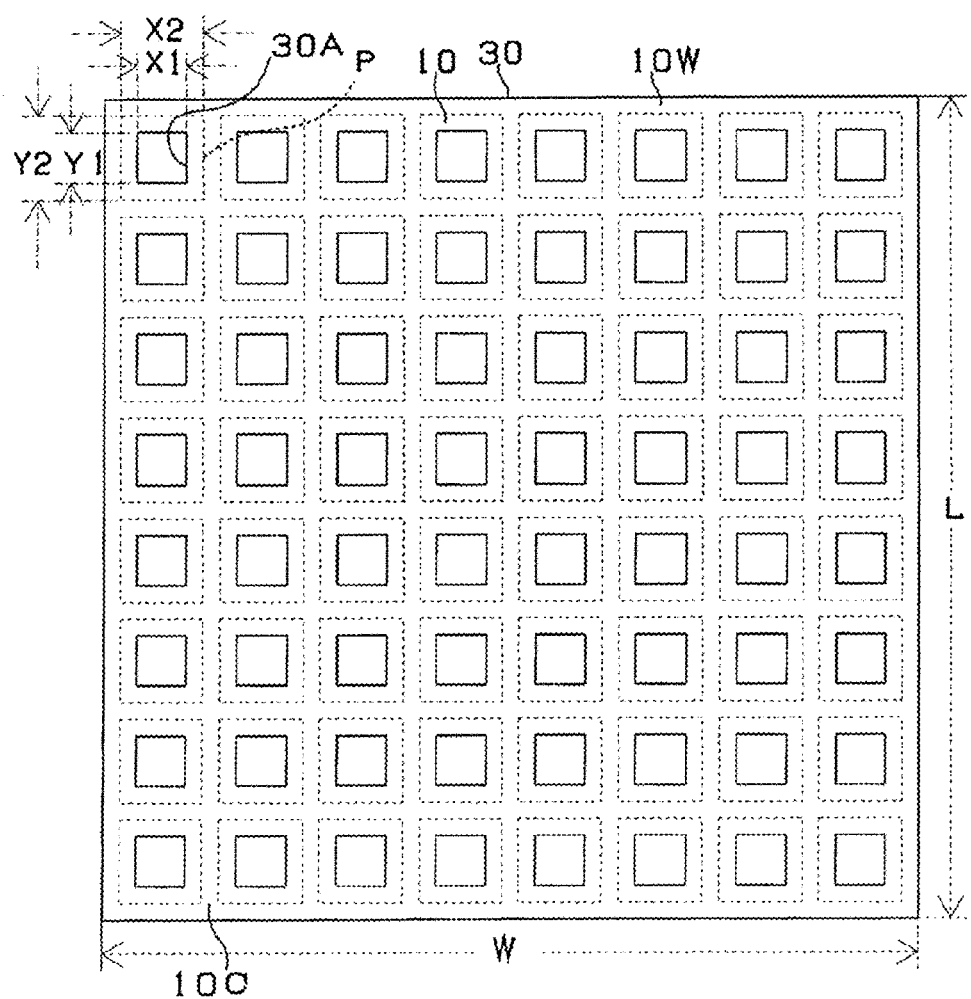
FIG. 6 is a plan view of a core substrate of the first embodiment.

The size of penetrating hole (30A) on the first surface of the core substrate is (X1×Y1), and the size of the product is (X2×Y2) (FIG. 6). The size of the penetrating hole (S1) and the size of the product (S2) satisfy the following relationships (i) and (ii). Relationship (ii) is a preferred example.

$$S1 = X1 \times Y1,\ S2 = X2 \times Y2,\ S1/S2 = 0.3\sim 0.7 \qquad (i)$$

$$S1 = X1 \times Y1,\ S2 = X2 \times Y2,\ S1/S2 = 0.5\sim 0.7 \qquad (ii)$$

As the (S1) increases, the rigidity of the core substrate decreases. However, if a printed wiring board of the first embodiment satisfies relationship (ii), warping or undulation is slight.

When S1/S2 is small, the volume of a core substrate is great. Thus, even if the values of thermal expansion coefficients and elastic moduli of the core substrate and filler resin are out of the range of the first embodiment, warping or undulation of the printed wiring board is slight. Thus, connection reliability and mounting productivity do not decrease. However, as S1/S2 increases, the rigidity of the core substrate decreases. In the same manner, the rigidity of the printed wiring board decreases. If S1/S2 is 30% or greater, due to warping or undulation of the printed wiring board, it is difficult to mount an electronic component on a surface of the printed wiring board. Connection reliability decreases between a surface-mounted component and the printed wiring board. However, according to a printed wiring board of the first embodiment, since the elastic moduli and thermal expansion coefficients of the filler resin and the core substrate are set at predetermined values, warping or undulation is slight in a printed wiring board having a penetrating hole for a built-in electronic component.

If S1/S2 is 50% or greater, warping or undulation is great in a printed wiring board where the values of thermal expansion coefficients and elastic moduli of the core substrate and filler resin are out of the range of the first embodiment. Accordingly, the printed wiring board may break during the manufacturing process. However, according to a printed wiring board of the first embodiment, since the elastic moduli and thermal expansion coefficients of the filler resin and the core substrate are set at predetermined values, warping or undulation is reduced in a printed wiring board having a penetrating hole for a built-in electronic component. Manufacturing productivity of printed wiring boards is enhanced. Also, during the process, stress is small between via conductors connecting electrodes of the electronic component and conductive circuits on a resin insulation layer. Therefore, connection reliability is high between the electronic component and conductive circuits. If S1/S2 exceeds 70%, since the rigidity of the core substrate is low, it is difficult to reduce warping or undulation.

(3) PET film 20 is laminated on the second surface of core substrate 30 via adhesive layer 22 (FIG. 1(D)). Penetrating hole (30A) is covered by the PET film.

Figure 9:
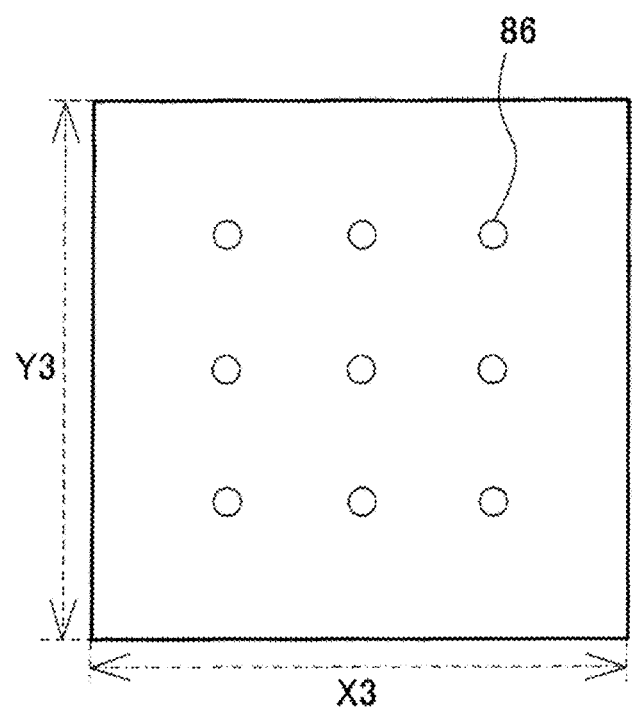
FIG. 9 is a plan view of an IC chip.

(4) IC chip 80 is laminated on the PET film in penetrating hole (30A) (8.3 mm×8.3 mm) of core substrate 30 (FIG. 2(A)). When the electronic component is an IC chip, the IC chip is positioned on the PET film in such a way that the rewiring layer of the IC chip faces the first surface of the core substrate in FIG. 2(A). The IC chip is positioned on the PET film so that the rewiring layer of the IC chip faces the PET film. The size of the electronic component such as an IC chip is (X3×Y3) (FIG. 9), which is the external size. The size of the electronic component and the size of penetrating hole (30A) satisfy the following relational formula.

$$(X3)\text{ is between }(X1-100\ \mu m)\text{ and }(X1-1000\ \mu m),\text{ and}$$
$$(Y3)\text{ is between }(Y1-100\ \mu m)\text{ and }(Y1-1000\ \mu m).$$

When the size of the penetrating hole is close to the size of an electronic component, since the rigidity of a printed wiring board of the first embodiment is enhanced, warping or undulation is reduced. If the distance between an inner wall of penetrating hole (30A) and the electronic component is less than 50 μm, since the amount of filler resin decreases, peeling tends to occur between the electronic component and the filler resin during a reflow process. If the distance between an inner wall of penetrating hole (30A) and the electronic component is greater than 500 μm, since the amount of filler resin increases, peeling tends to occur between the resin insulation layer and the filler resin during a reflow process. Also, cracking tends to occur in the filler resin. IC chip 80 has a rewiring layer.

(5) Filler resin 48 is filled between the inner walls of penetrating hole (30A) of core substrate 30 and IC chip 80 (FIG. 2(B)). The elastic modulus of the filler resin is 0.2 GPa or lower, and its thermal expansion coefficient is higher than 100 ppm but lower than 200 ppm. The elastic modulus and thermal expansion coefficient of the filler resin are set by selecting resin and adjusting the amount of inorganic particles.

(6) Filler resin 48 is preliminarily cured. PET film 20 is removed (FIG. 2(C)). Then, to remove the adhesive material of the PET film, the second surface of the electronic component is cleansed by a plasma treatment using Ar plasma or the like.

(7) Resin insulation layers (501, 502) (brand name: ABF-45SH, made by Ajinomoto) are formed on the core substrate, the electronic component and the filler resin (see FIG. 2(D)). The resin insulation layer on the first surface of the core substrate is first resin insulation layer 501, and the resin insulation layer on the second surface of the core substrate is second resin insulation layer 502. When the resin insulation layers are cured, the filler resin is also cured.

(8) Next, via-hole openings (50*a*) with a diameter of 80 μm are formed in resin insulation layers (501, 502) (see FIG. 3(A)).

(9) On resin insulation layers (501, 502), metal layer 52 is formed through electroless plating or the like (FIG. 3(B)).

(10) Plating resist 56 is formed on the metal layers (FIG. 3(C)).

(11) Electrolytic plated film 54 is formed on metal layer 52 exposed from the plating resist (see FIG. 4(A)).

(12) Plating resist 56 and the metal layer between portions of electrolytic copper-plated film are removed. Conductive circuits (581, 582) and via conductors (601, 602) made of metal layer 52 and electrolytic plated film 54 are formed (FIG. 4(B)). Surfaces of the conductive circuits and via holes are roughened using an etching solution (not shown in the drawings).

(13) Next, solder-resist layers (701, 702) having openings (711, 712) are formed on the first and second resin insulation layers (FIG. 4(C)).

(14) Metal film such as Sn is formed on the via conductors and conductive circuits exposed through openings (711, 712) (not shown in the drawings).

(15) Solder bumps (761, 762) are formed (FIG. 5). FIG. 6 shows a plan view of sheet-type printed wiring board 30 having multiple printed wiring boards 10. Sheet-type printed wiring board 30 includes multiple printed wiring boards 10 and connectors (10C) joining each printed wiring board. Moreover, sheet-type printed wiring board 30 has frame (10W) that surrounds multiple printed wiring boards 10. The sheet-type printed wiring board has length (L) and width (W).

Example 1

As for double-sided copper-clad laminate (30A), an MCL-E-679FG made by Hitachi Chemical Co., Ltd. is prepared (FIG. 1(A)). The thickness of the core substrate in Example 1 is 0.1 mm, its thermal expansion coefficient is 14 ppm, and its elastic modulus is 28 GPa. The size of a sheet (L×W) is 91 mm×91 mm (FIG. 6). Using a sheet, 64 (8×8) units of products are manufactured. The size of each product is 11 mm×11 mm. The (L) and (W) in FIG. 6 is 91 mm, and (X2) and (Y2) are 11 mm. Using a drill, penetrating holes 33 for through-hole conductors are formed in the copper-clad laminate. Electroless copper-plated film and electrolytic copper-plated film are formed on the inner walls of penetrating holes 33 and surfaces of double-sided copper-clad laminate (30A). Then, using a subtractive method, conductive circuits, through-hole conductors, through-hole lands 34, and conformal films (321, 322) are formed (FIG. 1(B)). Conformal film 321 formed on the first surface of the core substrate is formed directly above conformal film 322 with the core substrate positioned in-between. The periphery of conformal film 321 is positioned outside the periphery of conformal film 322. The size of conformal film 321 is approximately 8.3 mm×8.3 mm, and the size of conformal film 322 is approximately 7.8 mm×7.8 mm.

Next, a laser is irradiated along the outline of conformal film 321 from the first-surface side of the core substrate. Penetrating holes (30A) for built-in electronic components are formed (FIG. 1(C)). The size of a penetrating hole (X1× Y1) is 8.3 mm×8.3 mm. Thus, the area of the penetrating holes occupied in a sheet-type printed wiring board is approximately 53%, and the area of a penetrating hole occupied in each printed wiring board is approximately 57%. PET film 20 is laminated on the second surface of core substrate 30 via adhesive layer 22 (FIG. 1(D)).

IC chips 80 are laminated. An IC chip is preliminarily fixed in penetrating hole (30A) of core substrate 30 (FIG. 2(A)). The size of an IC chip (X3×Y3) is 7.5 mm×7.5 mm, and electrodes 90 face the first surface of the core substrate. Clearance (C) between an inner wall of penetrating hole (30A) and a side wall of an IC chip is 0.4 mm.

Filler resin 48 is filled between the inner wall of penetrating hole (30A) of core substrate 30 and IC chip 80 (FIG. 2(B)).

Filler resin 48 is preliminarily cured. PET film 20 is removed (FIG. 2(C)). Resin insulation layers (501, 502) (brand name: ABF-45SH, made by Ajinomoto) are formed on the core substrate, electronic component and filler resin (see FIG. 2(D)). During that time, filler resin is cured. The thermal expansion coefficient of the filler resin is 46 ppm and its elastic modulus is 4 GPa.

Next, via-hole openings (50*a*) with a diameter of 80 μm are formed in resin insulation layers (501, 502) (see FIG. 3(A)). Electroless copper-plated film 52 is formed on resin insulation layers (501, 502) (FIG. 3(B)). Plating resist 56 is formed on the electroless copper-plated film (FIG. 3(C)).

Electrolytic plated film 54 is formed on electroless copper-plated film 52 exposed from the plating resist (see FIG. 4(A)). Plating resist 56 and electroless copper-plated film between portions of electrolytic copper-plated film are removed. Conductive circuits and via conductors made of electroless copper-plated film 52 and electrolytic plated film 54 are formed (FIG. 4(B)).

Solder-resist layers with openings are formed on the first and second resin insulation layers (FIG. 4(C)). A sheet-type printed wiring board is completed. The sheet-type printed wiring board is placed on a flat board. The distance is measured between the flat board and the farthest point from the flat board (FIG. 8). Such a value is shown as a warping amount or an undulation amount in FIG. 7. The undulation amount in Example 1 is 1.69 mm.

Example 2

In Example 2, the size of a penetrating hole is modified from that in Example 1. The thickness of the core substrate is 0.1 mm, the same as in Example 1. The size of a penetrating hole in Example 2 is 8.1 mm×8.1 mm; and the clearance is 0.3 mm between an inner wall of penetrating hole (30A) and a side wall of an IC chip. Other than those, Example 2 is the same as in Example 1. The undulation amount in Example 2 is 1.55 mm.

Example 3

In Example 3, filler resin is modified from that in Example 2. The thickness of the core substrate is 0.1 mm, the same as in Example 1. The thermal expansion coefficient of the filler resin in Example 3 is 150 ppm, and its elastic modulus is 0.1 GPa. The undulation amount in Example 3 is 0.50 mm.

Example 4

In Example 4, filler resin is modified from that in Example 2. The thickness of the core substrate is 0.1 mm, the same as in Example 1. The thermal expansion coefficient of the filler resin in Example 4 is 167 ppm, and its elastic modulus is 0.07 GPa. The undulation amount in Example 3 is 1.11 mm.

Example 5

In Example 5, filler resin is modified from that in Example 2. The thickness of the core substrate is 0.1 mm, the same as in Example 1. The thermal expansion coefficient of the filler resin in Example 5 is 21 ppm, and its elastic modulus is 7.9 GPa. The undulation amount in Example 5 is 1.64 mm.

Example 6

In Example 6, the core substrate is modified from that in Example 2. The core substrate in Example 6 is LαXY4785TH-B made by Sumitomo Bakelite. The thermal expansion coefficient of the substrate is 5~6 ppm, and its elastic modulus is 32 GPa. The thickness of the core substrate is 0.1 mm, the same as in Example 1. The undulation amount in Example 6 is 0.84 mm.

Example 7

In Example 7, the core substrate is modified from that in Example 1. The core substrate in Example 7 is LαXY4785TH-B made by Sumitomo Bakelite. The thermal expansion coefficient of the substrate is 5~6 ppm, and its elastic modulus is 32 GPa. The thickness of the core substrate is 0.1 mm, the same as in Example 1. The undulation amount in Example 7 is 1.11 mm.

Example 8

In Example 8, filler resin is modified from that in Example 7. The thickness of the core substrate is 0.1 mm, the same as in Example 1. The thermal expansion coefficient of the filler resin in Example 8 is 150 ppm, and its elastic modulus is 0.1 GPa. The undulation amount in Example 8 is 0.21 mm.

Example 9

In Example 9, filler resin is modified from that in Example 7. The thickness of the core substrate is 0.1 mm, the same as in Example 1. The thermal expansion coefficient of the filler resin in Example 9 is 167 ppm, and its elastic modulus is 0.07 GPa. The undulation amount in Example 9 is 0.57 mm.

Example 10

In Example 10, the core substrate is modified from that in Example 1. The core substrate in Example 10 is Xenomax by Toyobo, its thermal expansion coefficient is 1.2 ppm, and its elastic modulus is 4 GPa. The thickness of the core substrate is 0.1 mm, the same as in Example 1. The undulation amount in Example 10 is 1.71 mm.

Example 11

In Example 11, the core substrate is modified from that in Example 2. The core substrate in Example 11 is Xenomax by Toyobo, its thermal expansion coefficient is 1.2 ppm, and its elastic modulus is 4 GPa. The thickness of the core substrate is 0.1 mm, the same as in Example 1. The undulation amount in Example 10 is 1.59 mm.

From the results of Example 1 through Example 11, the thermal expansion coefficient and elastic modulus of filler resin affect the undulation amount. Also, from the results in Examples 3, 4, 8 and 9, the thermal expansion coefficient and elastic modulus of the core substrate affect the undulation amount.

Using the thermal expansion coefficient and elastic modulus of the core substrate and the thermal expansion coefficient and elastic modulus of filler resin as parameters, relationships between those parameters and undulation or warping are examined through simulations. The target value of the warping amount or the undulation amount is 0.8 mm or smaller. When the warping amount or the undulation amount is 0.8 mm or smaller, the connection reliability between a printed wiring board and an electronic component flip-chip mounted on a surface of the printed wiring board clears the standard. Resistance change after heat-cycle testing is set at 10% or less in the standard. In heat-cycle testing, a printed wiring board is kept for five minutes each in an atmosphere of −55 degrees and 125 degrees. Such cycles are repeated 1000 times.

By referring to the results of Example 1 through Example 11, simulations are conducted. The elastic modulus of a core substrate is preferred to be higher than 30 GPa; the thermal expansion coefficient of the core substrate is preferred to be lower than 10 ppm; the elastic modulus of filler resin is preferred to be lower than 0.2 GPa; and the thermal expansion coefficient of the filler resin is preferred to be higher than 100 ppm but lower than 200 ppm. Since those values are based on the results of Example 1 through Example 11, it is believed that they are accurate values.

Example 12

Example 12 is a modified example of Example 9. In this example, an Si substrate instead of an IC chip is built in. Other than that, Example 12 is the same as Example 9. The thickness of the core substrate is 0.1 mm, the same as in Example 1. The undulation amount in Example 12 is 0.6 mm. From the simulation results and the result of Example 9, even if an Si substrate is built into a printed wiring board, the undulation amount is substantially the same as when an IC chip is built into a printed wiring board.

Example 13

In Example 13, the size of a penetrating hole is modified from that in Example 12. The size of a penetrating hole in Example 13 is 6.3 mm. The thickness of the core substrate is 0.1 mm, the same as in Example 1. The undulation amount in Example 13 is 0.4 mm.

Example 14

In Example 14, the size of a penetrating hole is modified from that in Example 12. The size of a penetrating hole in Example 14 is 6.8 mm. The thickness of the core substrate is 0.1 mm, the same as in Example 1. The undulation amount in Example 14 is 0.45 mm.

Example 15

In Example 15, the size of a penetrating hole is modified from that in Example 12. The size of a penetrating hole in Example 15 is 9.2 mm. The thickness of the core substrate is 0.1 mm, the same as in Example 1. The undulation amount in Example 15 is 0.57 mm.

Example 16

In Example 15, the size of a penetrating hole is modified from that in Example 12. The size of a penetrating hole in Example 16 is 9.5 mm. The thickness of the core substrate is 0.1 mm, the same as in Example 1. The undulation amount in Example 16 is 0.75 mm.

Reference Example 1

In Reference Example 1, the size of a penetrating hole is modified from that in Example 12. The size of a penetrating hole in Reference Example 1 is 10 mm. The thickness of the core substrate is 0.1 mm, the same as in Example 1. The undulation amount in Reference Example 1 is 1.75 mm.

Reference Example 2

In Reference Example 2, the size of a penetrating hole is modified from that in Example 12. The size of a penetrating hole in Reference Example 2 is 5.7 mm. The thickness of the core substrate is 0.1 mm, the same as in Example 1. The undulation amount in Reference Example 2 is 0.4 mm.

The size of an Si substrate built into a printed wiring board in Example 12 through Example 16 and in Reference Examples 1 and 2 is 80% of the size of the penetrating hole, and its thickness is the same, approximately 0.1 mm. Table 1 shows undulation amounts or warping amounts of printed wiring boards in Example 12 through Example 16 and in Reference Examples 1 and 2. Rate (1) in Table 1 shows the rate of area occupied by penetrating holes in a sheet-type printed wiring board.

From the results in Table 1, the target value of the undulation amount or the warping amount is achieved when the rate of area occupied by penetrating holes in a sheet-type printed wiring board is 70% or lower. When the rate of area occupied by penetrating holes in a sheet-type printed wiring board is approximately 30% or lower, the undulation amount or warping amount does not change. Accordingly, the rate of area occupied by penetrating holes in a sheet-type printed wiring board is preferred to be between 30% and 70%.

TABLE 1

| Example No | Size of Penetrating Hole | Rate (1) of Occupied Area | Undulation Amount or Warping Amount (mm) |
| --- | --- | --- | --- |
| Example 12 | 8.3 mm□ | 0.53 | 0.6 |
| Example 13 | 6.3 mm□ | 0.31 | 0.4 |
| Example 14 | 6.8 mm□ | 0.36 | 0.45 |
| Example 15 | 9.2 mm□ | 0.65 | 0.57 |
| Example 16 | 9.5 mm□ | 0.70 | 0.75 |
| Ref. Ex. 1 | 10 mm□ | 0.77 | 1.75 |
| Ref. Ex. 2 | 5.7 mm□ | 0.25 | 0.4 |

By cutting the sheet-type printed wiring board in Example 12 through Example 16 and in Reference Examples 1 and 2, individual printed wiring boards are manufactured, and their undulation amounts or warping amounts are measured. The values are shown in Table 2. Rate (2) is the rate of area occupied by a penetrating hole in an individual printed wiring board. A printed wiring board is placed on a flat board and its undulation amount or warping amount is measured (FIG. 8). The undulation amount or the warping amount is the distance from the flat board to the surface of the printed wiring board farthest from the flat board. From the results in Table 2, the target value of the undulation amount or warping amount is achieved when the rate of area occupied by the penetrating hole in a printed wiring board is 70% or lower. When the rate of area occupied by the penetrating hole in a printed wiring board is approximately 30% or lower, the undulation amount or the warping amount does not change. The target value of the warping amount is also 0.8 mm or smaller. Therefore, the rate of area occupied by the penetrating hole in a printed wiring board is preferred to be between 30% and 70%.

TABLE 2

| Example No | Size of Penetrating Hole | Rate (2) of Occupied Area | Undulation Amount or Warping Amount (mm) |
| --- | --- | --- | --- |
| Example 12 | 8.3 mm□ | 0.57 | 0.63 |
| Example 13 | 6.3 mm□ | 0.33 | 0.4 |
| Example 14 | 6.8 mm□ | 0.38 | 0.45 |
| Example 15 | 9.2 mm□ | 0.7 | 0.73 |
| Example 16 | 9.5 mm□ | 0.75 | 1.25 |
| Ref. Ex. 1 | 10 mm□ | 0.83 | 2.83 |
| Ref. Ex. 2 | 5.7 mm□ | 0.27 | 0.4 |

Example 17

In Example 17, the size of an IC chip is modified from that in Example 9. The size of an IC chip in Example 17 is 8.1 mm. Distance (C) is 0.1 mm between an inner wall of a penetrating hole and a side wall of an IC chip. The thickness of the core substrate is 0.1 mm, the same as in Example 1. The undulation amount in Example 17 is 0.63 mm.

Example 18

In Example 18, the size of an IC chip is modified from that in Example 9. The size of an IC chip in Example 18 is 7.3 mm. Distance (C) is 0.5 mm between an inner wall of a penetrating hole and a side wall of an IC chip. The thickness of the core substrate is 0.1 mm, the same as in Example 1. The undulation amount in Example 18 is 0.53 mm.

Example 19

In Example 19, the size of an IC chip is modified from that in Example 9. The size of an IC chip in Example 19 is 8.2 mm. The distance is 0.05 mm between an inner wall of a penetrating hole and a side wall of an IC chip. The thickness of the core substrate is 0.1 mm, the same as in Example 1. The undulation amount in Example 18 is 0.55 mm.

Reference Example 3

In Reference Example 3, the size of an IC chip is modified from that in Example 9. The size of an IC chip in Reference Example 3 is 8.22 mm. The distance is 0.04 mm between an inner wall of a penetrating hole and a side wall of an IC chip. The thickness of the core substrate is 0.1 mm, the same as in Example 1. In several printed wiring boards, peeling is observed between the IC chip and the filler resin after a reflow.

Reference Example 4

In Reference Example 4, the size of an IC chip is modified from that in Example 9. The size of an IC chip in Reference Example 4 is 7 mm. The distance is 0.65 mm between an inner wall of a penetrating hole and a side wall of an IC chip. The thickness of the core substrate is 0.1 mm, the same as in Example 1. In several printed wiring boards, cracking is observed in a resin insulation layer on the filler resin after a reflow.

The distance is preferred to be 0.05 mm to 0.5 mm between an inner wall of a penetrating hole and a side wall of an IC chip. The sheet-type printed wiring board in Example 1 and the sheet-type printed wiring board in Example 9 are put under a reflow process. The maximum temperature is 260 degrees. The undulation amounts are measured before and after the reflow. The undulation amount is increased by approximately 10% in Example 1. By contrast, the undulation amount in Example 9 is not changed. Simulations in each embodiment, each example and each reference example are performed using Mechanical 11.0 made by Ansys, Inc.

A printed wiring board according to an embodiment of the present invention has the following: a core substrate with a first surface and a second surface opposite the first surface and having a penetrating hole to accommodate an electronic component; an electronic component accommodated in the penetrating hole; filler resin formed in the penetrating hole to be in a clearance between the electronic component and the core substrate; a first resin insulation layer formed on the first surface of the core substrate and on the electronic component; and a second resin insulation layer formed on the second surface of the core substrate and on the electronic component. In such a printed wiring board, the elastic modulus of the filler resin is set to be lower than 0.2 Gpa, the thermal expansion coefficient of the filler resin is set to be higher than 100 ppm but lower than 200 ppm, the elastic modulus of the core substrate is set to be higher than 30 Gpa, and the thermal expansion coefficient of the core substrate is set to be lower than 10 ppm.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate having a penetrating hole extending through the core substrate;
   an electronic component accommodated in the penetrating hole of the core substrate;
   a filler resin filling a clearance between the electronic component and the core substrate;
   a first resin insulation layer formed on the electronic component and a first surface of the core substrate; and
   a second resin insulation layer formed on the electronic component and a second surface of the core substrate on an opposite side of the first surface of the core substrate,
   wherein the electronic component is an IC chip including a substrate, a die pad formed on the substrate, and a rewiring layer formed on the substrate, the rewiring layer includes a resin layer and a conductive layer which is connected to the die pad by a via hole formed in the resin layer, the penetrating hole is configured such that a distance between an inner wall of the penetrating hole and the electronic component is set in a range of from 50 μm to 500 μm, and that an area of the penetrating hole on the first surface of the core substrate is in a range of from 50% to 70% of an area of an external shape of the first surface of the core substrate, the filler resin has an elastic modulus which is set to be lower than 0.2 Gpa and a thermal expansion coefficient which is set to be higher than 100 ppm and lower than 200 ppm, and the core substrate has an elastic modulus which is set to be higher than 30 Gpa, and a thermal expansion coefficient which is set to be lower than 10 ppm.

2. The printed wiring board according to claim 1, wherein the penetrating hole is configured such that a distance between an inner wall of the penetrating hole and the electronic component is set in a range of from 50 μm to 400 μm.

3. The printed wiring board according to claim 2, wherein the IC chip has a thermal expansion coefficient of 3 to 5 ppm.

4. The printed wiring board according to claim 2, wherein the core substrate has the thermal expansion coefficient of 1 ppm or higher and lower than 10 ppm.

5. The printed wiring board according to claim 1, wherein the IC chip has a thermal expansion coefficient of 3 to 5 ppm.

6. The printed wiring board according to claim 1, wherein the core substrate has the thermal expansion coefficient of 1 ppm or higher and lower than 10 ppm.

7. The printed wiring board according to claim 1, wherein the resin layer of the rewiring layer is formed on the substrate.

8. A sheet-type printed wiring board, comprising:
   a plurality of printed wiring boards; and
   a plurality of connectors joining the printed wiring boards,
   wherein each of the printed wiring boards is a printed wiring board according to claim 1, and the penetrating holes are configured such that a total area of the penetrating holes on the first surfaces of the core substrates is in a range of from 30% to 70% of an area of a surface of the sheet-type printed wiring board.

9. A sheet-type printed wiring board, comprising:
   a plurality of printed wiring boards; and
   a plurality of connectors joining the printed wiring boards,
   wherein each of the printed wiring boards is a printed wiring board according to claim 1, and the penetrating holes are configured such that a total area of the penetrating holes on the first surfaces of the core substrates is in a range of from 50% to 70% of an area of a surface of the sheet-type printed wiring board.

10. A sheet-type printed wiring board, comprising:
    a plurality of printed wiring boards; and
    a frame surrounding the plurality of printed wiring boards,
    wherein each of the printed wiring boards is a printed wiring board according to claim 1, the penetrating holes are configured such that a total area of the penetrating holes on the first surfaces of the core substrates is in a range of from 30% to 70% of an area of a surface of the sheet-type printed wiring board, and the sheet-type printed wiring board has the area of the surface which includes an area of the frame.

11. A sheet-type printed wiring board, comprising:
    a plurality of printed wiring boards; and
    a frame surrounding the plurality of printed wiring boards,
    wherein each of the printed wiring boards is a printed wiring board according to claim 1, the penetrating holes are configured such that a total area of the penetrating holes on the first surfaces of the core substrates is in a range of from 50% to 70% of an area of a surface of the sheet-type printed wiring board, and the sheet-type printed wiring board has the area of the surface which includes an area of the frame.

* * * * *